(12) United States Patent
Joshi et al.

(10) Patent No.: US 6,322,849 B2
(45) Date of Patent: Nov. 27, 2001

(54) RECOVERY OF ELECTRONIC PROPERTIES IN HYDROGEN-DAMAGED FERROELECTRICS BY LOW-TEMPERATURE ANNEALING IN AN INERT GAS

(75) Inventors: Vikram Joshi; Narayan Solayappan, both of Colorado Springs, CO (US); Walter Hartner; Günther Schindler, both of Munich (DE)

(73) Assignees: Symetrix Corporation, Colorado Springs, CO (US); Spemens AG, Munich (DE)

( * ) Notice: Subject to any disclaimer, the term of this patent is extended or adjusted under 35 U.S.C. 154(b) by 0 days.

(21) Appl. No.: 09/191,634

(22) Filed: Nov. 13, 1998

(51) Int. Cl.[7] .................................................. B05D 5/12
(52) U.S. Cl. ........................ 427/96; 427/126.3; 427/380; 438/3; 438/340
(58) Field of Search ........................... 427/62, 96, 126.3, 427/379, 380, 376.2; 438/3, 240

(56) References Cited

U.S. PATENT DOCUMENTS

| 5,057,463 | 10/1991 | Bryant et al. . |
| 5,166,095 | 11/1992 | Hwang . |

(List continued on next page.)

FOREIGN PATENT DOCUMENTS 0 669 655 A2    8/1995   (EP) .

OTHER PUBLICATIONS

Khamankar et al., "Impact of post processing damages on the performance of high dielectric constan PLZT thin film capacitors for ULSI DRAM applications," IEEE (New York), p. 337–340 (1994).

Hadad et al., "The Effects Of Forming Gas Anneal On The Electrical Characteristics Of Ir–Electroded BST Thin Film Capacitors," Integrated Ferroelectrics, Gordon & Breach (The Netherlands), vol. 17 (No. 1–4), p. 461–469 (1997).

Furuya et al., "Electrical Characteristics of SrBi2Ta2O9 Capacitor after Aluminum Metallization," Japanese Journal of Applied Physics, vol. 37 (No. 7), p. 4037–4040 (Jul., 1998).

Evans et al., "Effect of Hydrogen Anneals on Niobium–Doped Lead Zirconate Titanate Capacitors with Lanthanum Strontium Cobalt Oxide/Platinum Electrodes," Japanese Journal of Applied Physics, vol. 38 (No. 9B), p. 5361–5363 (Sep., 1999).

*Primary Examiner*—Brian K. Talbot
(74) *Attorney, Agent, or Firm*—Patton Boggs LLP

(57) ABSTRACT

An integrated circuit is formed containing a metal-oxide ferroelectric thin film. An inert-gas recovery anneal is conducted to reverse the degradation of ferroelectric properties caused by hydrogen. The inert-gas recovery anneal is conducted in an unreactive gas atmosphere at a temperature range from 300° to 1000° C. for a time period from one minute to two hours. Preferably, the metal-oxide thin film comprises layered superlattice material. Preferably, the layered superlattice material comprises strontium bismuth tantalate or strontium bismuth tantalum niobate. If the integrated circuit manufacture includes a forming-gas anneal, then the inert-gas recovery anneal is performed after the forming-gas anneal, preferably at or near the same temperature and for the same time duration as the forming-gas anneal. The inert-gas recovery anneal obviates oxygen-recovery annealing, and it allows continued use of conventional hydrogen-rich plasma processes and forming-gas anneals without the risk of permanent damage to the ferroelectric thin film. The unreactive gas atmosphere can contain a pure unreactive gas or a mixture of unreactive gases. The unreactive gas can be any relatively unreactive gas, such as nitrogen or argon.

7 Claims, 6 Drawing Sheets

U.S. PATENT DOCUMENTS

| | | |
|---|---|---|
| 5,525,528 | 6/1996 | Perino et al. . |
| 5,644,158 * | 7/1997 | Fujii et al. ............................ 257/532 |
| 6,115,281 * | 9/2000 | Aggarwal et al. ................... 365/145 |
| 6,130,103 * | 10/2000 | Cuchiaro et al. ........................ 438/3 |
| 6,165,802 * | 12/2000 | Cuchiaro et al. ........................ 438/3 |
| 6,171,934 * | 1/2001 | Joshi et al. ........................... 438/469 |

* cited by examiner

RECOVERY OF ELECTRONIC PROPERTIES IN HYDROGEN-DAMAGED FERROELECTRICS BY LOW-TEMPERATURE ANNEALING IN AN INERT GAS

BACKGROUND OF THE INVENTION

1. Field of the Invention

The invention relates to a method for fabricating a ferroelectric integrated circuit that reduces or eliminates the degradation of electronic properties resulting from exposure to hydrogen.

2. Statement of the Problem

Ferroelectric compounds possess favorable characteristics for use in nonvolatile integrated circuit memories. See Miller, U.S. Pat. No. 5,046,043. A ferroelectric device, such as a capacitor, is useful as a nonvolatile memory when it possesses desired electronic characteristics, such as high residual polarization, good coercive field, high fatigue resistance, and low leakage current. Lead-containing $ABO_3$-type ferroelectric oxides such as PZT (lead zirconium titanate) and PLZT (lead lanthanum zirconium titanate) have been studied for practical use in integrated circuits. Layered superlattice material oxides have also been studied for use in integrated circuits. See Watanabe, U.S. Pat. No. 5,434,102. Layered superlattice materials exhibit characteristics in ferroelectric memories that are orders of magnitude superior to those of PZT and PLZT compounds. Integrated circuit devices containing ferroelectric elements are currently being manufactured. Nevertheless, the persistent problem of hydrogen degradation during the manufacturing process hinders the economical production in commercial quantities of ferroelectric memories and other IC devices using either the $ABO_3$-type oxides or the layered superlattice material compounds with the desired electronic characteristics.

A typical ferroelectric memory in an integrated circuit contains a semiconductor substrate and a metal-oxide semiconductor field-effect transistor (MOSFET) in electrical contact with a ferroelectric device, usually a ferroelectric capacitor. A ferroelectric capacitor typically contains a ferroelectric thin film located between a first or bottom electrode and a second or top electrode, the electrodes typically containing platinum. During manufacture of the circuit, the MOSFET is subjected to conditions causing defects in the silicon substrate. For example, the CMOS/MOSFET manufacturing process usually includes high energy steps, such as ion-mill etching and plasma etching. Defects also arise during heat treatment for crystallization of the ferroelectric thin film at relatively high temperatures, often in the range 500°–900° C. As a result, numerous defects are generated in the single crystal structure of the semiconductor silicon substrate, leading to deterioration in the electronic characteristics of the MOSFET.

To restore the silicon properties of the MOSFET/CMOS, the manufacturing process typically includes a forming-gas, or hydrogen, annealing ("FGA") step, in which defects such as dangling bonds are eliminated by utilizing the reducing property of hydrogen. Various techniques have been developed to effect the hydrogen annealing, such as $H_2$-gas heat treatment in ambient conditions. Conventionally, hydrogen treatments are conducted between 350° and 550° C., typically around 400–450° C. for a time period of about 30 minutes. In addition, the CMOS/MOSFET manufacturing process requires other fabrication steps that expose the integrated circuit to hydrogen, often at elevated temperatures, such as hydrogen-rich plasma CVD processes for depositing metals and dielectrics, growth of silicon dioxide from silane or TEOS sources, and etching processes using hydrogen and hydrogen plasma. During processes that involve hydrogen, the hydrogen diffuses through the top electrode and the side of the capacitor to the ferroelectric thin film and reduces the oxides contained in the ferroelectric material. The absorbed hydrogen also metallizes the surface of the ferroelectric thin film by reducing metal oxides. As a result of these effects, the electronic properties of the capacitor are degraded. This problem is acute in ferroelectric memories containing layered superlattice material compounds because these oxide compounds are particularly complex and prone to degradation by hydrogen-reduction. After the forming-gas anneal (FGA), the remanent polarization of the ferroelectrics is very low and no longer suitable for storing information. Also, an increase in leakage currents results.

Several methods have been reported in the art to inhibitor reverse hydrogen degradation of desired electronic properties in ferroelectric oxide materials. Oxygen-annealing at high temperature (800° C.) for about one hour results in virtually complete recovery of the ferroelectric properties degraded by hydrogen treatments. But the high-temperature oxygen-anneal itself may generate defects in silicon crystalline structure, and it may offset somewhat the positive effects of any prior forming-gas anneal on the CMOS characteristics. Special metallization layers and diffusion barrier layers have also been examined to minimize the effects of hydrogen during high-energy process steps and forming-gas annealing steps. The metallization schemes typically involve the use of materials that are prone to oxidation in an oxygen-containing environment at temperatures above 400° C. Aluminum, the primary metallization material, has a low melting point and cannot tolerate temperatures above 450° C. Encapsulation of the ferroelectric material with a hydrogen diffusion barrier layer is not completely effective practically, and it requires complex process schemes including depositing and removing the barrier material.

It is, therefore, desirable to find a method for fabricating ferroelectric integrated circuits that eliminates the degradation of electronic properties resulting from hydrogen-containing processing steps, but which does not add substantial changes to conventional CMOS processing or introduce complicated process schemes, such as encapsulation of ferroelectric material with hydrogen diffusion barriers.

3. Solution to the Problem

The invention provides a method for fabricating ferroelectric elements in integrated circuits that reverses the detrimental effects of hydrogen in ferroelectric material oxides, avoids addition of complex and expensive processing schemes, and obviates counterproductive oxygen annealing. By eliminating high-temperature $O_2$-recovery annealing and other complicated processing steps, such as encapsulation of the ferroelectric with diffusion barriers, previously considered essential for minimizing hydrogen degradation, the inventive method allows FeRAM manufacturers to continue using conventional hydrogen-rich plasma processes and forming-gas anneals (for surface-state curing) without the risk of permanent damage to the ferroelectric element.

A primary feature of the invention is performing an inert-gas recovery anneal to reverse the effects of hydrogen degradation, thereby restoring desired electronic and ferroelectric properties of the ferroelectric element. The inert-gas recovery anneal is preferably performed after hydrogen-plasma processes, forming-gas anneal steps, and other high-energy steps of integrated circuit formation causing reducing conditions.

Gases used in inert-gas recovery anneals may be any relatively unreactive gases, such as nitrogen and the noble gases, in particular, argon and helium. A pure unreactive gas or a mixture of unreactive gases may be used. Gases typically used for an inert-gas recovery anneal are nitrogen and argon.

Another feature of the invention is that the ferroelectric element comprises metal oxides. The metal-oxide material can be an $ABO_3$-type perovskite compound, such as PZT (lead zirconium titanate) and PLZT (lead lanthanum zirconium titanate). Preferably the metal-oxide is a ferroelectric layered superlattice material, such as strontium bismuth tantalate (SBT) or strontium bismuth tantalum niobate (SBTN).

The inert-gas recovery anneal is typically conducted at a temperature range from 300° to 1000° C. for a time duration of one minute or longer. If the integrated circuit fabrication process includes a forming-gas anneal, the forming-gas anneal is typically conducted at a temperature range from 300° to 1000° C. for a time duration of from one minute to two hours. If the integrated circuit fabrication process includes a forming-gas anneal, preferably the inert-gas recovery anneal is conducted at about the same temperature and time duration at which the forming-gas anneal was performed. Experimental results have shown that if a forming-gas anneal is performed in the temperature range of about from 400° C. to 450° C. for about 30 minutes, then the ferroelectric and electronic properties of the ferroelectric element are practically fully recovered when an inert-gas recovery anneal is conducted in the temperature range of about from 400° C. to 450° C. for about 30 minutes.

Numerous other features, objects and advantages of the invention will become apparent from the following description when read in conjunction with the accompanying drawings.

DETAILED DESCRIPTION OF THE PREFERRED EMBODIMENT

1. Overview

Figure 1:
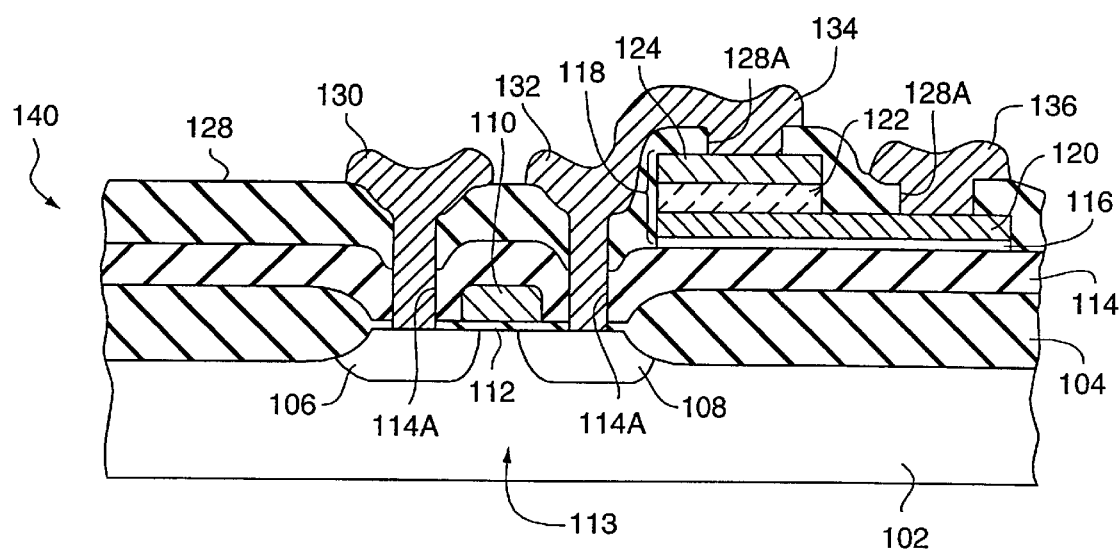
FIG. 1 is a cross-sectional view of a portion of an integrated circuit as may be fabricated by the method of the invention showing a nonvolatile ferroelectric memory cell in which the capacitor is offset laterally from the switch.
Figure 2:
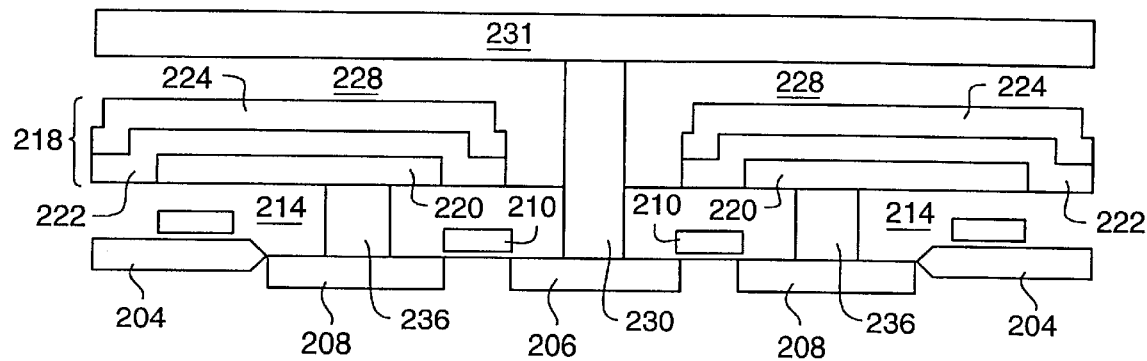
FIG. 2 is a schematic of a cross-sectional view of a portion of an integrated circuit as may be fabricated by the method of the invention showing a stacked nonvolatile ferroelectric memory cell in which the capacitor is located above the switch.
Figure 3:
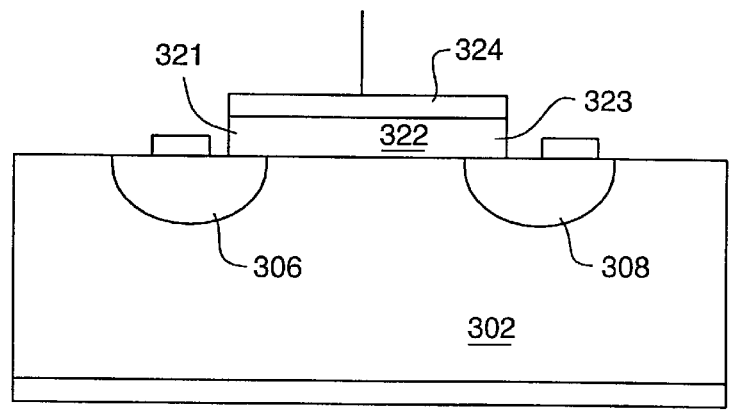
FIG. 3 is a schematic of a cross-sectional view of a portion of an integrated circuit as may be fabricated by the method of the invention showing a ferroelectric transistor.

It should be understood that the FIGS. 1–3, 5–6 depicting ferroelectric integrated circuit devices are not meant to be actual plan or cross-sectional views of any particular portion of an actual integrated circuit device. In the actual devices, the layers will not be as regular and their thicknesses may have different proportions. The various layers in actual devices often are curved and possess overlapping edges. The figures instead show idealized representations which are employed to depict more clearly and fully the method of the invention than would otherwise be possible. Also, the figures represent only one of innumerable variations of ferroelectric devices that could be fabricated using the method of the invention. FIG. 1 depicts a ferroelectric memory containing a switch in the form of a field effect transistor in electrical connection with a ferroelectric capacitor. FIG. 2 depicts a ferroelectric memory containing a stacked ferroelectric capacitor connected via a plug to the switch element below. But it is also contemplated to use the method of this invention to fabricate a ferroelectric FET memory in which the ferroelectric element is incorporated in the switch element, as depicted in FIG. 3. Such a ferroelectric FET is described in McMillan, U.S. Pat. No. 5,523,964, which is incorporated herein by reference. Likewise, other integrated circuits fabricated using the method of the invention could include other elements and compositions of material.

Directing attention to FIG. 1, there is shown a cross-sectional view of an exemplary nonvolatile ferroelectric memory cell that could be fabricated according to the method of the invention. The general manufacturing steps for fabricating integrated circuits containing MOSFETs and ferroelectric capacitor elements is described in Yoshimori, U.S. Pat. No. 5,561,307, which is hereby incorporated by reference as if completely contained herein. General fabrication methods have been described in other references also. Therefore, the elements of the circuit of FIG. 1 will be simply identified here.

In FIG. 1, a field oxide region 104 is formed on a surface of a silicon substrate 102. A source region 106 and a drain region 108 are formed separately from each other within silicon substrate 102. A gate insulating layer 112 is formed on the silicon substrate 102 between the source and drain regions 106 and 108.

Further, a gate electrode 110 is formed on the gate insulating layer 112. The source region 106, drain region 108, gate insulating layer 112 and gate electrode 110 together form a MOSFET 113.

An interlayer dielectric layer (ILD) 114 made of BPSG (boron-doped phosphosilicate glass) is formed on substrate 102 and field oxide region 104. An adhesive layer 116 is formed on a portion of ILD 114, and then a ferroelectric thin film capacitor 118 is formed on adhesive layer 116. The adhesive layer 116 is made of, for example, titanium, and typically has a thickness of 200 Å.

Ferroelectric capacitor 118 is preferably formed on a conventional wafer 140 that may comprise silicon, gallium arsenide or other semiconductor, or an insulator, such as silicon dioxide, glass or magnesium oxide (MgO). The bottom and top electrodes of ferroelectric capacitors conventionally contain platinum. It is preferable that the bottom electrode contains a non-oxidized precious metal such as platinum, palladium, silver, and gold. In addition to the precious metal, metal such as aluminum, aluminum alloy, aluminum silicon, aluminum nickel, nickel alloy, copper alloy, and aluminum copper may be used for electrodes of a ferroelectric memory. Adhesive layers, such as titanium, enhance the adhesion of the electrodes to adjacent underlying or overlying layers of the circuits.

In FIG. 1, the ferroelectric capacitor 118 comprises a bottom electrode 120 made of platinum and having a thickness of 2000 Å (angstroms), a ferroelectric thin film 122 formed on the bottom electrode 120, and a top electrode 124 formed on the ferroelectric film 122, made of platinum and having a thickness of 2000 Å. The composition and structure of the ferroelectric thin film 122 is discussed in more detail below.

A second interlayer dielectric layer (ILD) 128 made of NSG (nondoped silicate glass) is formed on ILD 114. A PSG (phospho-silicate glass) film or a BPSG film could also be used in ILD 128. Openings 114A are selectively opened through ILD 114 and ILD 128 to expose the source region 106 and gate region 108. Source electrode wiring 130 and drain electrode wiring 132 are formed to fill openings 114A. Other openings 128A are selectively opened through ILD 128 to expose top electrode 124 and bottom electrode 120. Top electrode wiring 134 and bottom electrode wiring 136 are formed to fill these openings 128a. The drain electrode wiring 132 is electrically connected to top electrode wiring 134. Each of these wirings 130, 132, 134 and 136 is made of Al-Si with a thickness of about 3000 Å.

In FIG. 2, there is shown a cross-sectional view of an alternative embodiment of an exemplary nonvolatile ferroelectric memory cell that could be fabricated according to the method of the invention. The memory of FIG. 2 is a stacked nonvolatile ferroelectric memory cell in which the capacitor is located above the switch. FIG. 2 depicts field oxide regions 204, source region 206, drain regions 208 and gate region 210. The source region 206 is connected by wiring via 230 to metallized circuit connection layer 231. Drain regions 208 are connected by wiring via 236 to bottom electrodes 220 through ILD 214. Ferroelectric thin films 224 are located on bottom electrodes 220, and top electrodes 224 are on thin films 222. After patterning, layers 220, 222 and 224 form capacitors 218, which are covered by ILD 228.

In FIG. 3, there is shown a cross-sectional view of an exemplary nonvolatile ferroelectric transistor that could be fabricated according to the method of the invention. Source region 306 and drain region 308 are located in silicon semiconductor substrate 302. Ferroelectric thin film 322 is located on substrate 302, a portion 321 of thin film 322 being in contact with source region 306, and a portion 323 of thin film 322 being in contact with drain region 308. Top electrode layer 324 is in electrical contact with the rest of the integrated circuit.

The composition of the ferroelectric thin films 122, 222, 322 can be selected from a group of suitable ferroelectric materials, including but not limited to: an $ABO_3$-type perovskite, such as a titanate (e.g., $BaTiO_3$, $SrTiO_3$, $PbTiO_3$ (PT), $(PbLa)(ZrTi)O_3$ (PLZT), $Pb(ZrTi)O_3$ (PZT)) or a niobate (e.g., $KNbO3$), and, preferably, a layered superlattice material.

U.S. Pat. No. 5,519,234 issued May 21, 1996, incorporated herein by reference, discloses that layered superlattice compounds, such as strontium bismuth tantalate (SBT), have excellent properties in ferroelectric applications as compared to the best prior materials and have high dielectric constants and low leakage currents. U.S. Pat. No. 5,434,102 issued Jul. 18, 1995 and U.S. Pat. No. 5,468,684 issued Nov. 21, 1995, incorporated herein by reference, describe processes for integrating these materials into practical integrated circuits. Ferroelectric layered superlattice materials, like the metal oxides $SrBi_2Ta_2O_9$ (SBT) and $SrBi_2(Ta_{1-x}Nb_x)_2O_9$ (SBTN), where $0 \leq x \leq 1$, are currently under development for use as capacitor dielectric in nonvolatile memory applications (FeRAM).

The layered superlattice materials may be summarized generally under the formula:

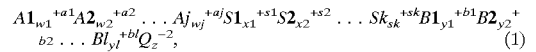

$$A1_{w1}^{+a1} A2_{w2}^{+a2} \ldots Aj_{wj}^{+aj} S1_{x1}^{+s1} S2_{x2}^{+s2} \ldots Sk_{sk}^{+sk} B1_{y1}^{+b1} B2_{y2}^{+b2} \ldots Bl_{yl}^{+bl} Q_z^{-2}, \quad (1)$$

where A1, A2 ... Aj represent A-site elements in the perovskite-like structure, which may be elements such as strontium, calcium, barium, bismuth, lead, and others; S1, S2 ... Sk represent super lattice generator elements, which usually is bismuth, but can also be materials such as yttrium, scandium, lanthanum, antimony, chromium, thallium, and other elements with a valence of +3; B1, B2 ... Bl represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements, and the subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $SrBi_2(Ta_{0.75}N_{0.25})_2O_9$, on the average, 75% of the B-sites are occupied by a tantalum atom and 25% of the B-sites are occupied by a niobium atom. If there is only one A-site element in the compound, then it is represented by the "A1" element and w2 ... wj all equal zero. If there is only one B-site element in the compound, then it is represented by the "B1" element, and y2 ... yl all equal zero, and similarly for the superlattice generator elements. The usual case is that there is one A-site element, one superlattice generator element, and one or two B-site elements, although formula (1) is written in the more general form since the invention is intended to include the cases where either of the sites and the superlattice generator can have multiple elements. The value of z is found from the equation:

$$(a1w1+a2w2 \ldots +ajwj)+(s1x1+s2x2 \ldots +skxk)+(b1y1+b2y2 \ldots +blyl)=2z. \quad (2)$$

Formula (1) includes all three of the Smolenskii type compounds discussed in U.S. Pat. No. 5,519,234 issued May 21, 1996, which is hereby incorporated by reference as though fully incorporated herein. The layered superlattice materials do not include every material that can be fit into the formula (1), but only those which spontaneously form themselves into crystalline structures with distinct alternating layers.

The word "compound" used precisely refers to a homogeneous substance in which the identical molecules all comprise the same chemical elements and structure. The term "material" may comprise molecules of different composition. For example, the layered superlattice material strontium bismuth tantalum niobate comprises interconnected crystal lattices in which two different kinds of atoms, tantalum and niobium, occupy variously the B-site positions of the crystal structure. Nevertheless, the terms "layered superlattice material", "layered superlattice compound", and "layered superlattice material compound" are used virtually interchangeably in this specification and their meaning is clear from the context.

The word "substrate" can mean the underlying wafer 102 on which the integrated circuit is formed, as well as any object on which a thin film layer is deposited, such as BPSG layer 114. In this disclosure, "substrate" shall mean the object to which the layer of interest is applied; for example, when we are talking about a bottom electrode, such as 120, the substrate includes the layers 116 and 114 on which the electrode 120 is formed.

The term "thin film" is used herein as it is used in the integrated circuit art. Generally, it means a film of less than a micron in thickness. The thin films disclosed herein are in all instances less than 0.5 microns in thickness. Preferably, the ferroelectric thin films 122 are 200 Å to 3000 Å thick, and most preferably 1200 Å to 2500 Å thick. These thin films of the integrated circuit art should not be confused with the layered capacitors of the macroscopic capacitor art which are formed by a wholly different process which is incompatible with the integrated circuit art.

The term "stoichiometric" herein may be applied to both a solid film of a material, such as a layered superlattice material, or to the precursor for forming a material. When it is applied to a solid thin film, it refers to a formula which shows the actual relative amounts of each element in a final solid thin film. When applied to a precursor, it indicates the molar proportion of metals in the precursor. A "balanced" stoichiometric formula is one in which there is just enough of each element to form a complete crystal structure of the material with all sites of the crystal lattice occupied, though in actual practice there always will be some defects in the crystal at room temperature. For example, both $SrBi_2(TaNb)O_9$ and $SrBi_2(Ta_{1.44}Nb_{0.56})O_9$ are balanced stoichiometric formulas. In contrast, a precursor for strontium bismuth tantalum niobate in which the molar proportions of strontium, bismuth, tantalum, and niobium are 1, 2.18, 1.44, and 0.56, respectively, is represented herein by the unbalanced "stoichiometric" formula $SrBi_{2.18}(Ta_{1.44}Nb_{0.56})O_9$, since it contains excess bismuth beyond what is needed to form a complete crystalline material. In this disclosure, an "excess" amount of a metallic element means an amount greater than required to bond with the other metals present to make the desired material, with all atomic sites occupied and no amount of any metal left over. However, as known in the art, because bismuth oxide is highly volatile and significant heat is used in fabricating electronic devices according to the invention, the molar proportion of bismuth in a solid ferroelectric layer 122, 422, made according to the process of the invention will generally be less than that in the stoichiometric formula for the precursor. However, the molar proportions of strontium, tantalum, and niobium in ferroelectric layer 122, 422, made according to the process of the invention will be very close or identical to the molar proportions given in the stoichiometric formula for the precursor. See U.S. Pat. No. 5,434,102 issued to Watanabe, et al.

It is also known in the art that a layered superlattice material made from a precursor with an amount of superlattice generator element or B-site element in excess of the stoichiometrically balanced amount is more resistant to degradation by hydrogen than material made from a precursor containing amounts of metal corresponding to a balanced stoichiometric formula. For example, amounts in the precursor of at least one metal, such as bismuth and niobium, above or in addition to that present in a balanced formula, inhibit hydrogen degradation.

Figure 4:
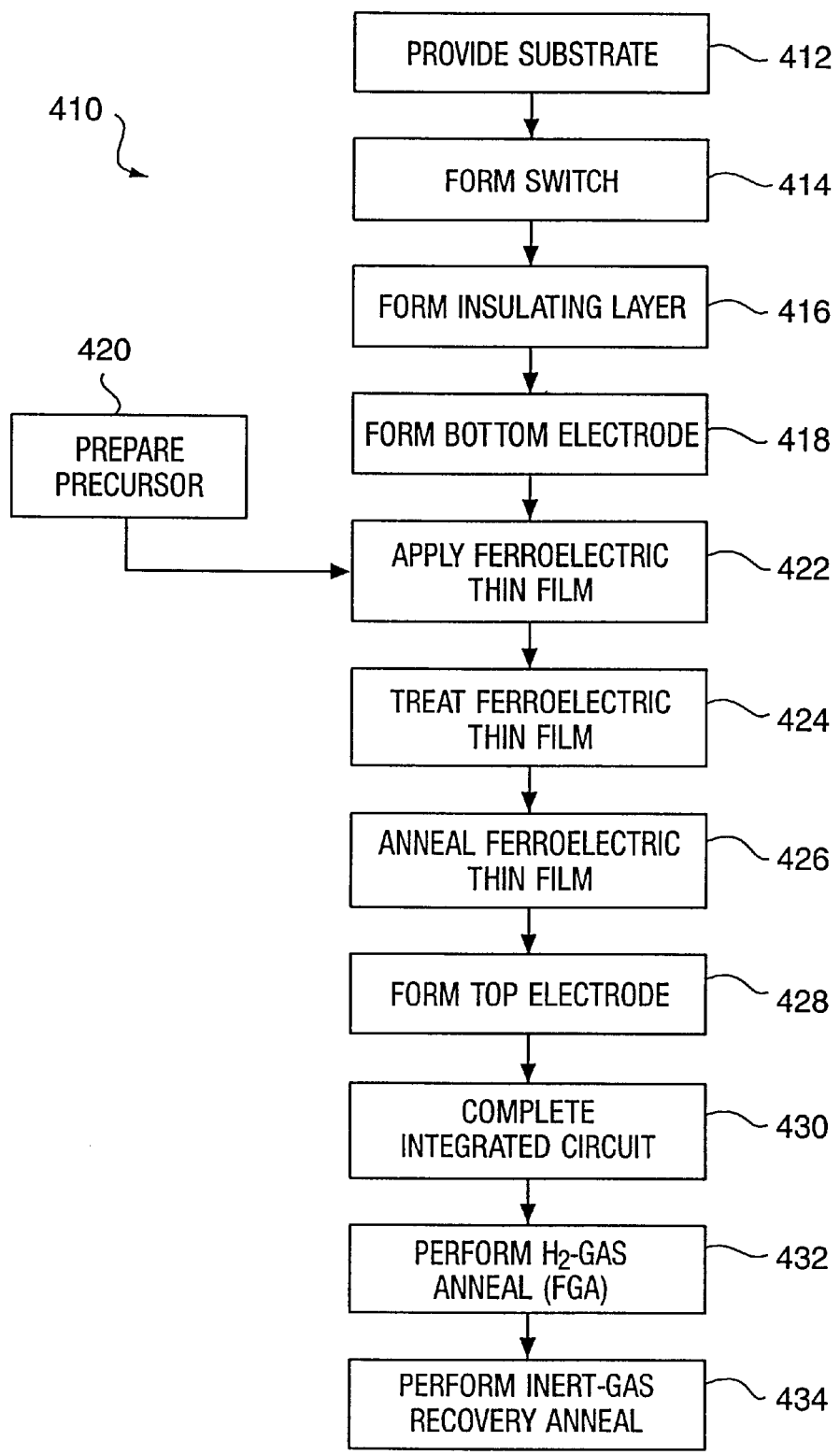
FIG. 4 is a flow chart showing the preferred embodiment of a process for fabricating a nonvolatile ferroelectric memory device according to the invention.

The diagram of FIG. 4 is a flow sheet of the fabrication steps of the process 410 including the method of this invention to make a ferroelectric memory. In step 412, a semiconductor substrate is provided on which a switch is formed in step 414.

The switch is typically a MOSFET. In step 416, an insulating layer is formed to separate the switching element from the ferroelectric element to be formed. In step 418, a bottom electrode is formed. Preferably, the electrode is made of platinum and is sputter-deposited to form a layer with a thickness of about 2000 Å. In the preferred method, an adhesion layer made of titanium or titanium nitride of about 200 Å would be formed in this step prior to depositing the electrode. The ferroelectric thin film is applied to the bottom electrode in step 422. In the preferred method, the ferroelectric thin film contains layered superlattice material. An MOCVD method is the most preferred method to form the thin film. The ferroelectric thin films also can be applied using a liquid deposition technique, such as a spin-coating or a misted deposition method as described in U.S. Pat. No. 5,456,945. In step 420, chemical precursors of the layered superlattice material that will form the desired ferroelectric thin film are prepared. Usually, precursor solutions are prepared from commercially available solutions containing the chemical precursor compounds. A preferred embodiment utilizes a precursor solution containing relative molar proportions of the elements strontium, bismuth, and tantalum corresponding approximately to the formula $SrBi_2Ta_2O_9$. An alternative preferred embodiment utilizes a precursor solution containing relative molar proportions of the elements strontium, bismuth, tantalum and niobium corresponding approximately to the formula $SrBi_2(Ta_{1-x}Nb_x)_2O_9$, where x is about 0.5. Preferably, the concentrations of the various precursors supplied in the commercial solutions are adjusted in step 420 to accommodate particular manufacturing or operating conditions. For example, the stoichiometric amounts of the various elements in a commercial solution for a layered superlattice thin film might be $SrBi_{2.18}(Ta_{1.44}Nb_{0.56})O_9$. It might be desirable, however, to add extra niobium or bismuth to this solution to generate extra oxides that will protect the ferroelectric compounds from hydrogen-annealing degradation. The application step 422 is preferably followed by a treatment step 424, which preferably includes a drying step in case of liquid deposition, a crystallization substep at elevated temperatures such as a rapid thermal process (RTP), and may include treatment with ultraviolet radiation during or after the application step 422. For example, in a typical spin-on procedure, a coat of the precursor might be applied and dried. Then another precursor coat might be applied and dried. The application and treatment steps 422 and 424 can be repeated several times. The treated film is then annealed in oxygen to form the resulting ferroelectric thin film in step 426. Following steps 422–426, the top electrode is formed in step 428. Step 428 and other steps typically include high-energy material deposition and patterning substeps, such as target sputtering, ion milling or RIE-etching, and ashing.

The circuit is generally completed in step 430, which can include a number of substeps; for example, deposition of an ILD, patterning and milling, and deposition of wiring layers.

In step 432, hydrogen annealing of the workpiece is conducted at a temperature and annealing time chosen to satisfactorily eliminate the defects caused in the silicon substrate by oxygen heat treatment and other high-energy processing steps. The hydrogen annealing step is preferably performed with a forming-gas anneal (FGA) using an $H_2$-gas mixture (e.g., 1–5% $H_2$ in $N_2$) under ambient conditions because this is less complex than other alternatives. Preferably, the forming-gas anneal is performed at a temperature in the range 400–450° C. for about 30 minutes.

In step 434, the inert-gas recovery anneal of the invention is conducted to restore the electronic properties of the ferroelectric element that were degraded as a result of hydrogen annealing and other process steps causing hydrogenating or reducing conditions. Inert-gas recovery annealing performed at a temperature range of from 300° to 1000° C. for a time period from one minute to two hours effectively reverses the degradation of electronic properties caused by hydrogen reduction in the ferroelectric element. The beneficial effects of the inert-gas recovery anneal generally increase as the inert-gas anneal temperature increases and the annealing duration increases. Preferably, the inert-gas recovery anneal of the integrated circuit is conducted under ambient conditions in an unreactive-gas atmosphere at the same temperature or close to the temperature of the forming-gas anneal, and for about the same time duration as the forming-gas anneal. Therefore, in inert-gas annealing step 434 of the preferred embodiment of process 410, the integrated circuit portion is located in an unreactive-gas atmosphere at a temperature in the range 400–450° C. for about 30 minutes.

In the field of integrated circuit fabrication, nitrogen gas is generally considered to be nonreactive or unreactive. The unreactive-gas atmosphere can be pure $N_2$ or other unreactive gas, such as a noble gas (e.g., argon), or it can be a mixture of unreactive gases.

The inert-gas recovery anneal of the present invention is effective in protecting the electronic characteristics of metal-oxide ferroelectric materials, including $ABO_3$-type perovskites and layered superlattice materials. In particular, experiments have shown that the inert-gas recovery anneal treatment is effective in restoring desired ferroelectric properties in layered superlattice compounds made from a precursor solution with a composition corresponding approximately to the general stoichiometric formula $SrBi_2Ta_2O_9$.

Figure 5:
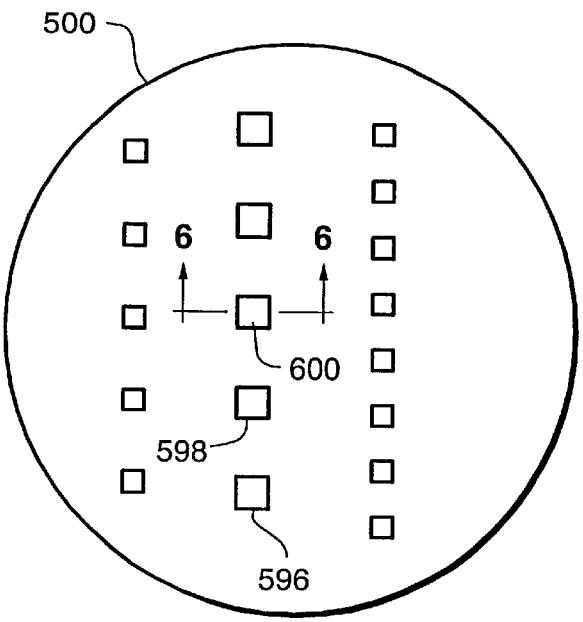
FIG. 5 is a top view of an exemplary wafer on which thin film capacitors fabricated in accordance with the invention are shown greatly enlarged.
Figure 6:
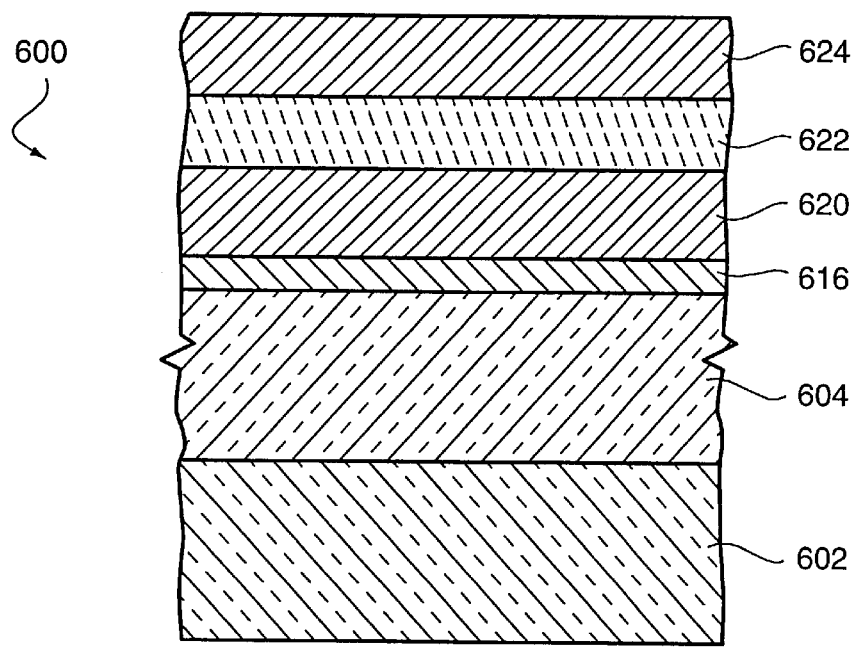
FIG. 6 is a portion of a cross-section of FIG. 5 taken through the lines 6—6, illustrating a thin film capacitor device fabricated in accordance with the invention.

FIG. 5 is a top view of an exemplary wafer on which thin film capacitors 596, 598 and 600 fabricated on substrate 500 in accordance with the invention are shown greatly enlarged. FIG. 6 is a portion of a cross-section of FIG. 5 taken through the lines 6—6, illustrating a thin film capacitor device fabricated in accordance with the invention. A silicon dioxide layer 604 is formed on a silicon crystal substrate 602. A titanium adhesion layer 616 is formed on the silicon dioxide layer 604. Then bottom electrode 620 made of platinum is sputter-deposited on adhesion layer 616. Layer 622 is a ferroelectric thin film, and layer 624 represents the top electrode made of platinum.

EXAMPLE 1

The electronic properties of strontium bismuth tantalate capacitors were studied before and after a forming-gas anneal at a temperature of 430° C. for 30 minutes. Then the capacitors were treated with an inert-gas recovery anneal using pure $N_2$-gas at 430° C. for 30 minutes, and the electronic properties were measured again.

The capacitors were fabricated from a strontium bismuth tantalate (SBT) precursor solution commercially available from the Kojundo Chemical Corporation. The solution contained amounts of chemical precursors corresponding to the stoichiometric formula $SrBi_2Ta_2O_9$. The 0.2 mol/l precursor commercial solution contained: bismuth 2-ethylhexanoate, strontium 2-ethyihexanoate, and tantalum 2-ethylhexanoate. Ferroelectric capacitors containing the layered superlattice compound were formed from the precursor solution in general accordance with the method described in Watanabe, U.S. Pat. No. 5,434,102, which is hereby incorporated by reference as if wholly contained herein.

A series of p-type 100 Si wafer substrates 602 were oxidized to form a layer of silicon dioxide 604. A titanium adhesive layer 616 with a thickness in the range of 100–200 Å was sputtered on the substrate, then a bottom platinum electrode 620 with a thickness in the range of 1000–3000 Å thickness was sputter-deposited on adhesive layer 616. These were annealed 30 minutes in $O_2$ at 650° C., and dehydrated 30 minutes at 180° C. in low vacuum. The 0.2 molar SBT-precursor solution was diluted with n-butyl acetate to 0.12 molar concentration prior to deposition. A spincoat of the 0.12 molar solution of the SBT-precursor was deposited on the bottom electrode 620 at 1800 rpm for 30 seconds. This was dehydrated for one minute at 160° C., increasing to 260° C. for four minutes. The sequence of the spincoat and dehydration steps was repeated. The coating was crystallized using rapid-thermal-annealing (RTA 725° C., 30 sec, 100° C./sec). These steps formed a ferroelectric thin film 622 having a thickness of 1700 Å (170 nm). The wafer and deposited layers were given a first anneal for 60 minutes at 800° C. in $O_2$-gas or $N_2$-gas. Platinum was sputter-deposited to make a top electrode layer 624 with a thickness in the range of 1000–2000 Å thickness. The platinum and strontium bismuth tantalate layers were milled to form the capacitors, and then ashing was performed, followed by a second anneal for 30 minutes at 800° C. in $O_2$-gas or $N_2$-gas.

Before the capacitors were annealed in hydrogen gas, the electronic properties of five capacitors, each with an area of 7854 $\mu m^2$, were measured.

A forming-gas anneal (FGA) was then performed on the capacitors in a $H_2$—$N_2$ ($H_2$ 5%) mixture under ambient conditions, at 430° C. for 30 minutes.

Finally, inert-gas recovery annealing was performed on the capacitor samples that had been subjected to the FGA. The samples were annealed in pure $N_2$-gas at a flow rate of 5 l/m, at a temperature of 430° C. for 30 minutes. The remnant polarization and the coercive field were measured at three volts, and the current density was measured between 0 and 10 volts.

Figure 7:
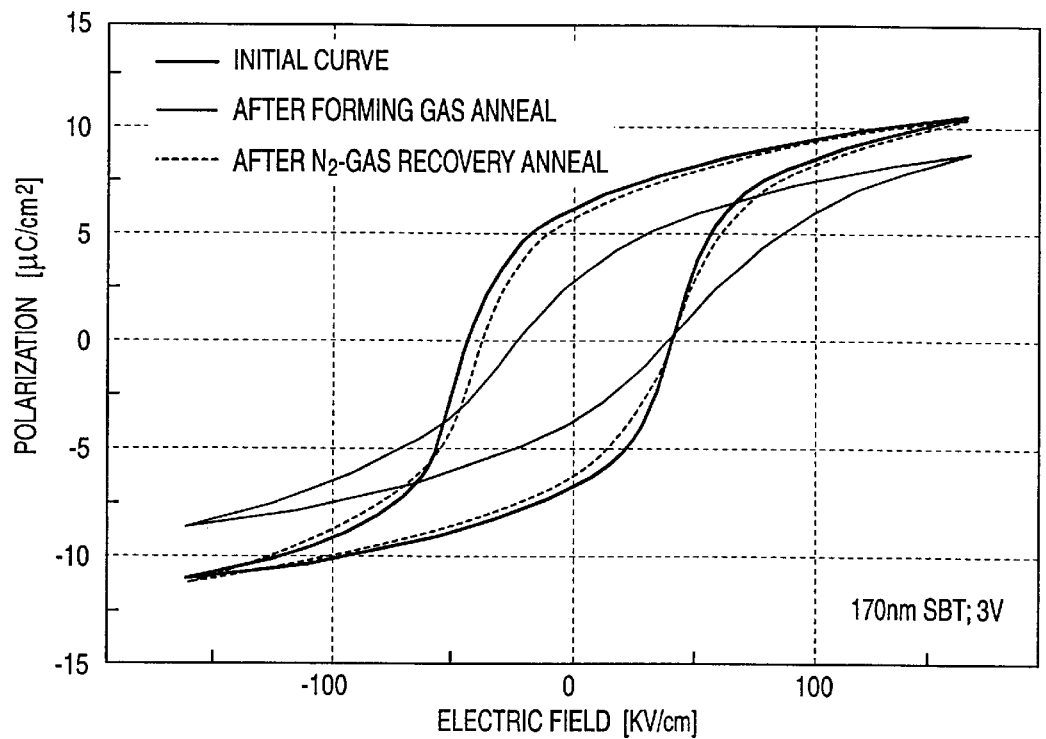
FIG. 7 is a graph of hysteresis curves measured at 3 volts, in which polarization, $\mu C/cm^2$, is plotted as a function of electric field, kV/cm, for strontium bismuth tantalate thin-film capacitors before forming-gas anneal, after forming-gas anneal at 430° C. for 30 minutes, and after $N_2$-gas recovery anneal at 430° C. for 30 minutes.
Figure 8:
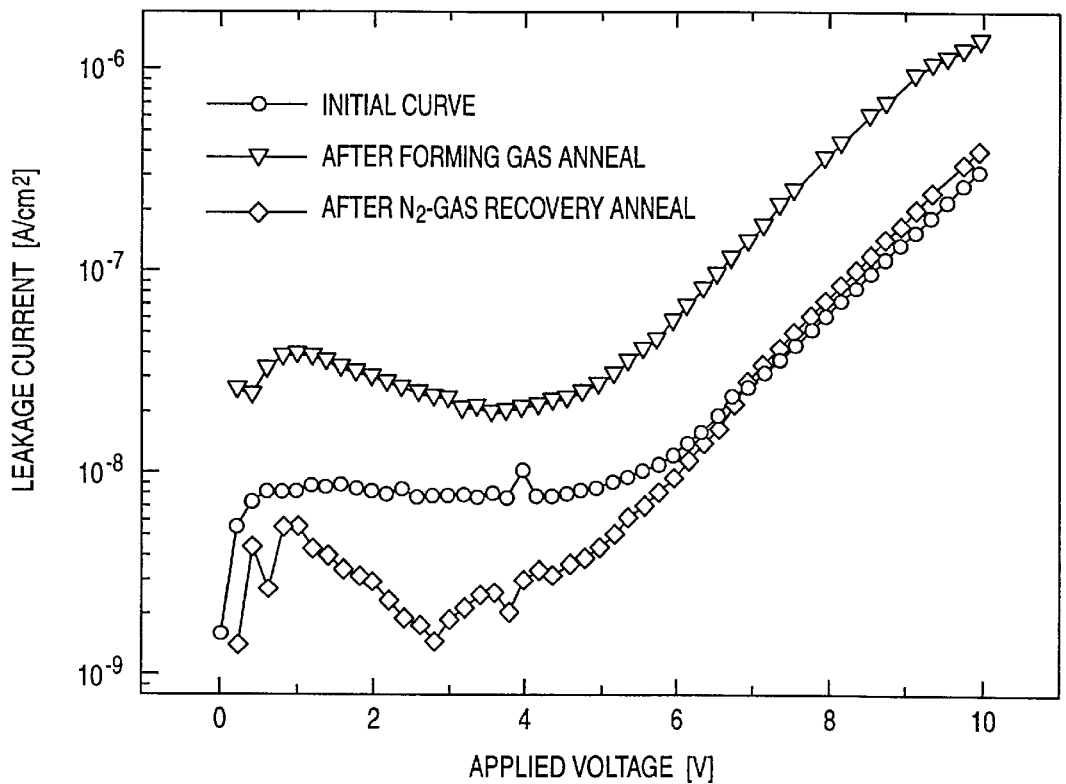
FIG. 8 is a graph of leakage current, $A/cm^2$, versus applied voltage in volts in strontium bismuth tantalate capacitors before forming-gas anneal, after forming-gas anneal at 430° C. for 30 minutes, and after $N_2$-gas recovery anneal at 430° C. for 30 minutes.

FIG. 7 is a graph of hysteresis curves measured at three volts, in which polarization, $\mu C/cm^2$, is plotted as a function of electric field, kV/cm, for the strontium bismuth tantalate thin-film capacitors before the forming-gas anneal, after the forming-gas anneal at 430° C. for 30 minutes, and after the $N_2$-gas recovery anneal at 430° C. for 30 minutes. FIG. 8 is a graph of the leakage current, $A/cm^2$, versus applied voltage in volts in the strontium bismuth tantalate capacitors before the forming-gas anneal, after the forming-gas anneal at 430° C. for 30 minutes, and after the $N_2$-gas recovery anneal at 430° C. for 30 minutes.

Based on the measurements depicted in FIG. 7, the samples tested had a remanent polarization, 2Pr, of 19.06 $\mu C/cm^2$ measured at ±3 volts before the forming-gas anneal. After the forming-gas anneal, the polarization decreased to 10.24 $\mu C/cm^2$. After the recovery anneal in pure nitrogen, the polarization increased to 18.11 $\mu C/cm^2$, which is 95% of its initial value. FIG. 8 shows that the leakage current in the test transistors increased by a factor of about five as a result of the forming gas anneal. After the $N_2$-gas recovery anneal, however, the leakage current was equal to or even lower than in the original sample.

EXAMPLE 2

Figure 9:
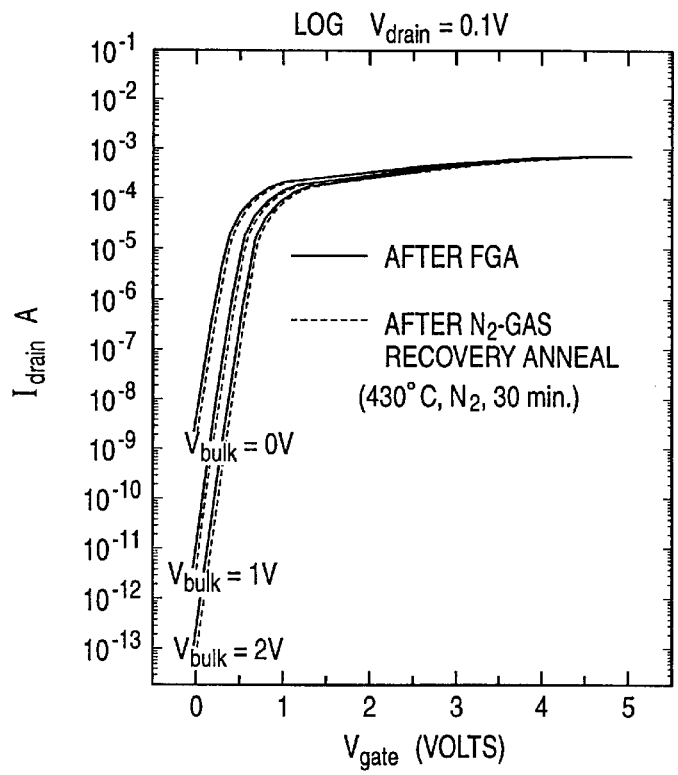
FIG. 9 is a graph in which the $\log_{10}$ of drain current, $I_{drain}$, in amps of test transistors is plotted as a function of $V_{gate}$ in volts for three different bulk voltages, $V_{bulk}$, measured after a forming-gas anneal (FGA) and then after a subsequent $N_2$-gas recovery anneal.
Figure 10:
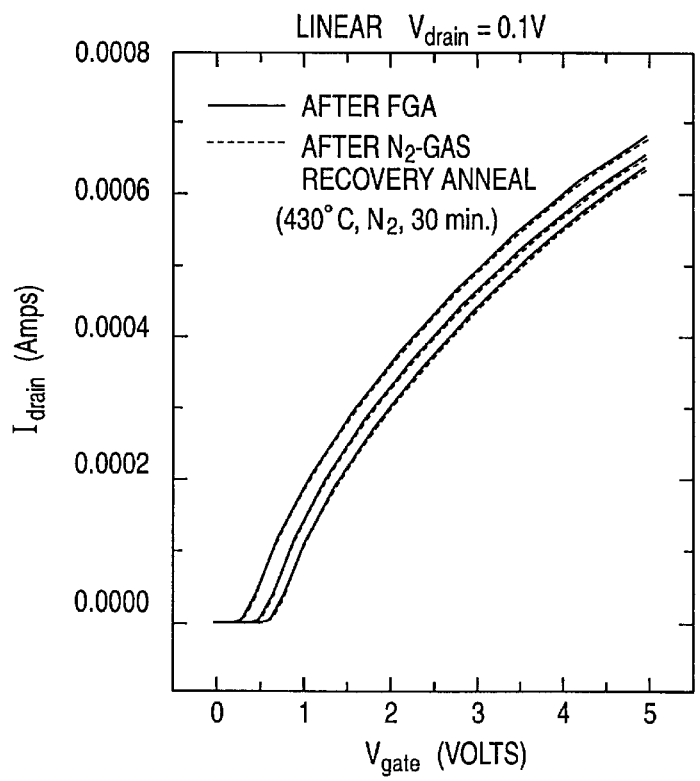
FIG. 10 is a graph in which the drain current, $I_{drain}$, in amps of test transistors is plotted as a function of $V_{gate}$ in volts for three different bulk voltages, $V_{bulk}$, measured after a forming-gas anneal (FGA) and after a subsequent $N_2$-gas recovery anneal.

The effect of nitrogen recovery annealing after FGA on the electronic characteristics of transistor chips was studied. The drain-current was measured as a function of gate voltage after a forming-gas anneal at 430° C. for 30 minutes. Then a $N_2$-gas recovery anneal was performed at 430° C. for 30 minutes and the same type of current versus voltage measurement was performed. FIG. 9 is a graph in which the $\log_{10}$ of drain current, $I_{drain}$, in amps is plotted as a function of $V_{gate}$ in volts of test transistors for three different bulk voltages, $V_{bulk}$, after the forming-gas anneal and after the subsequent $N_2$-gas recovery anneal. FIG. 10 is a graph in which the drain current, $I_{drain}$, in amps is plotted as a function of $V_{gate}$ in volts of test transistors for three different bulk voltages, $V_{bulk}$, after the forming-gas anneal and after the subsequent $N_2$-gas recovery anneal. FIGS. 7 and 8 show that no change in the electronic characteristics of the transistor occurred.

Thus, the results of Examples 1 and 2 show that an inert-gas recovery anneal effectively recovers the ferroelectric properties of a ferroelectric metal-oxide thin film, while minimizing the damage to surface states of silicon substrates and CMOS/MOSFET elements.

The method of the invention may be used alone or in combination with other methods, devices and compositions intended to inhibit or reverse the detrimental effects of hydrogen degradation. Even though the invention is intended to obviate the need for such other measures, it can, nevertheless, be used with them; for example, with hydrogen barrier layers. The method of the invention is useful to reverse hydrogen degradation, regardless of how it is caused. Reducing conditions can arise in many circumstances during integrated circuit fabrication; even routine handling of the wafer can result in hydrogen degradation. Thus, the inert-gas recovery anneal is useful even if an integrated circuit has not been subjected to a forming-gas anneal.

There has been described a method for fabricating ferroelectric integrated circuits that permits exposure to hydrogen and still results in ferroelectric devices with good electrical properties. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. For example, now that an inert-gas recovery anneal of the integrated circuit has been identified as an important part of the process for fabricating ferroelectric memory devices, this method can be combined with other processes to provide variations on the method described. It is also evident that the steps recited may, in some instances, be performed in a different order; or equivalent structures and processes may be substituted for the various structures and processes described. Consequently, the invention is to be construed as embracing each and every novel feature and novel combination of features present in and/or possessed by the fabrication processes, electronic devices, and electronic device manufacturing methods described.

We claim:

1. A method for fabricating an integrated circuit comprising the steps of:

forming an integrated circuit non-volatile memory portion including a thin film of ferroelectric layered superlattice material, said ferroelectric layered superlattice material having remanent polarization, and said memory portion further including a circuit for switching said remanent polarization; and conducting an inert-gas recovery anneal by locating said integrated circuit portion in an unreactive-gas atmosphere at a temperature range from 300° C. to 1000° C. for a time duration of one minute or longer.

2. A method according to claim 1 wherein said ferroelectric layered superlattice material comprises strontium bismuth tantalate.

3. A method according to claim 1 wherein said ferroelectric layered superlattice material comprises strontium bismuth tantalum niobate.

4. A method according to claim 1 further comprising a step of performing a forming-gas anneal before conducting said inert-gas recovery anneal.

5. A method according to claim 4 wherein said forming-gas anneal is performed at a temperature range from 300° C. to 1000° C. for a time duration from one minute to two hours.

6. A method according to claim 5 wherein said inert-gas recovery anneal is conducted at about the same temperature and time duration at which said forming-gas anneal is performed.

7. A method according to claim 6 wherein said forming-gas anneal is performed in the temperature range of about from 400° C. to 450° C. for about 30 minutes, and said inert-gas recovery anneal is conducted in the temperature range of about front 400° C. to 450° C. for about 30 minutes.

* * * * *

UNITED STATES PATENT AND TRADEMARK OFFICE
CERTIFICATE OF CORRECTION

PATENT NO. : 6,322,849 B1
DATED : November 27, 2001
INVENTOR(S) : Vikram Joshi, Narayan Solayappan, Walter Hartner and Gunther Schindler It is certified that error appears in the above-identified patent and that said Letters Patent is hereby corrected as shown below:

<u>Title page,</u>
Item [73] Assignees replace "Symetrix Corporation, Colorado Springs, CO (US); Spemens AG, Munich (DE)" with -- Symetrix Corporation, Colorado Springs, CO (US); Infineon Technologies AG, Munich (DE) --.

Signed and Sealed this

Twenty-first Day of May, 2002

*Attest:*

JAMES E. ROGAN
*Director of the United States Patent and Trademark Office*

*Attesting Officer*